United States Patent [19]

Lemaire

[11] Patent Number: 4,920,563
[45] Date of Patent: Apr. 24, 1990

[54] CIRCUIT COMPENSATING FOR THE ATTENUATION OF A NOTCH FILTER AT FREQUENCIES LESS THAN CUT-OFF FREQUENCY THEREOF

[75] Inventor: Frédéric Lemaire, Saint Egreve, France

[73] Assignee: SGS-Thomson Microelectronics S.A., Gentilly, France

[21] Appl. No.: 310,113

[22] Filed: Feb. 14, 1989

[30] Foreign Application Priority Data

Feb. 16, 1988 [FR] France ............................ 88 02176

[51] Int. Cl.$^5$ ............................................... H03H 5/02
[52] U.S. Cl. ........................................ 379/413; 307/520; 333/176
[58] Field of Search ............... 333/175, 176, 213; 307/520; 379/413, 405, 345, 414, 415, 324, 399

[56] References Cited

U.S. PATENT DOCUMENTS

| | | | |
|---|---|---|---|
| 4,078,205 | 11/1976 | Van Schoiack | 330/107 |
| 4,383,229 | 5/1983 | Jones | 333/176 |

FOREIGN PATENT DOCUMENTS

| | | | |
|---|---|---|---|
| 3337834 | 3/1985 | Fed. Rep. of Germany | |
| 0157502 | 6/1988 | Japan | 333/175 |

OTHER PUBLICATIONS

"Active Filters Incorporating the Voltage-to-Current Transactor," Microelectronics, vol. 8, No. 3, pp. 19–22.

*Primary Examiner*—Jin F. Ng
*Assistant Examiner*—Randall S. Vaas
*Attorney, Agent, or Firm*—Lowe, Price, Leblanc, Becker & Shur

[57] ABSTRACT

A circuit compensating for the attenuation caused on a line by an LS series type notch filter at frequencies less than the filter cut-off frequency, with such filter connected across said line and a reference voltage, includes a first resistor (R) in series on the line, a series circuit comprising a capacitor (C1) and a second resistor (R1) connected across the line and reference voltage, the capacitor being connected on the side of a first terminal of the first resistor, and an amplifier, the input of which is connected to the connection point of a capacitor and second resistor and the output of which is connected to the second terminal of the first resistor, such amplifier having a transconductance at said lower frequencies capable of ensuring the injection of a current equal to the sum of currents deviated by the series circuit and the filter.

5 Claims, 1 Drawing Sheet

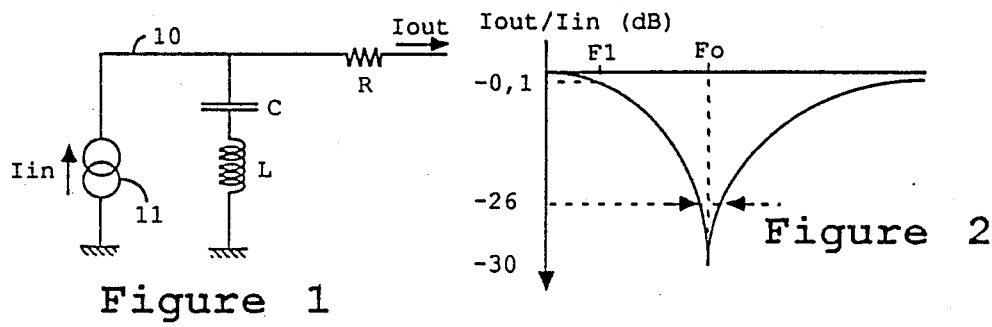
Figure 1
Figure 2
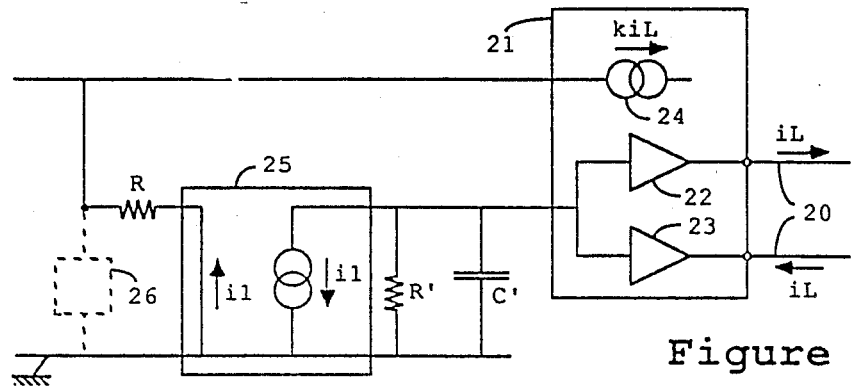
Figure 3
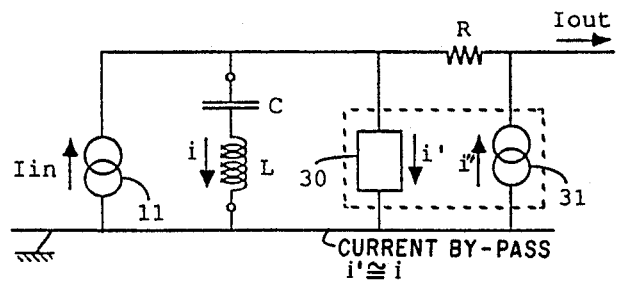
Figure 4
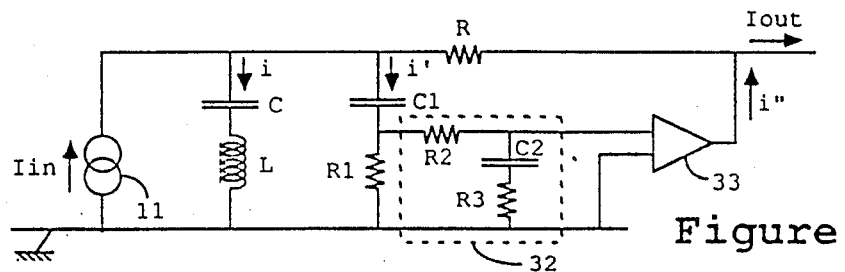
Figure 5

CIRCUIT COMPENSATING FOR THE ATTENUATION OF A NOTCH FILTER AT FREQUENCIES LESS THAN CUT-OFF FREQUENCY THEREOF

BACKGROUND OF THE INVENTION

The instant invention relates to a circuit for compensating a notch filter attenuation at frequencies less than cut-off frequency thereof. More specifically, it concerns the application of such a circuit in the field of telephony to a Subscriber Line Interface Circuit (SLIC).

FIGS. 1 to 3 are to illustrate the problem that the instant invention intends to resolve.

FIG. 1 shows a line 10 wherein is interposed a resistor R and wherein current $I_{in}$ is supplied by a current source 11. An LC serial filter is connected across the line and a reference voltage node (currently the ground) to remove a definite frequency $F_0$.

The response curve of an LC serial filter is schematically shown in FIG. 2. It can be seen that if attenuation is optimum, for frequency $F_0$, it is far from negligible at frequencies remote from $F_0$. For instance, if $F_0$ is substantially equal to 15,000 Hz, attenuation will still be 0.1 dB at frequency $F_1$ in the order of 3,500 Hz while the band width at 26 dB will be in the order of 250 Hz.

The drawbacks of such a filter are illustrated hereinafter as part of a particular embodiment.

FIG. 3 is a highly schematic representation of a Subscriber Line Interface Circuit (SLIC). Such circuits are conventionally arranged at the Central Office Exchange to establish connection with each subscriber line 20. In particular, they ensure that the Central Office Exchange has a given output impedance, for instance for French standards, a resistive impedance equal to 600 ohms in the 300–3,400 Hz frequency band. Such impedance accuracy is defined under various standards and characterized by the so-called return loss (RL) attenuation measurement. This measurement characterizes the difference between the desired impedance ZO and the real impedance Z by the relationship $RL = 20 \log |(Z-ZO)/(Z+ZO)|$. This return loss RL is defined in France as having to be better than 20 dB.

Conventionally, an electronic subscriber interface is achieved by using one or more integrated circuits. In the example disclosed herein, there is a first integrated circuit 21 comprising more particularly balanced amplifiers 22 and 23 with gain G, driving the line, and means 24 for measuring line current $i_L$ and supplying a current signal proportional to $i_L$, $ki_L$. By means of a resistor R and a current mirror 25, this current is returned to a resistor R' which applies a feedback voltage to the input of amplifiers 22 and 23, said resistor being connected in parallel with capacitor C' designed to ensure loop stability. The elements shown in block 21 form, for example, part of the telephone integrated circuit marketed under reference TDB 7722 by the Company SGS Thomson and current mirror 25 forms part of another telephone integrated circuit marketed by SGS Thomson under reference TDB 7711.

Of course, means for entering the voice signal to be transmitted or for receiving the incident voice signal are provided in the integrated circuits at access terminals, not shown.

These various circuits produce highly satisfactory operation, i.e., matching attenuation greater than 20 dB in the 300–3,400 Hz frequency range.

In some cases, it is desirable to add to a telephone system a subscriber remote-charging system (telecharge). For this purpose, a high-frequency signal has to be transmitted on the line, for instance in the order of 15,000 Hz. However, because the impedance of the SLIC is not matched to these high frequencies, only a very weak signal will be sent on the line. Therefore, in the prior art, the addition of a filter was considered for instance in block 26 shown in dotted lines in FIG. 3. This filter lowers the impedance of the SLIC at the frequency of the charging signal.

However, if a single filter as shown in FIG. 1 is used, as is generally the case, the drawback presented previously is still found, i.e., the upper part of the useful frequency range (e.g. 300–3,400 Hz) has a signal which is unduly attenuated so that the SLIC no longer assumes its impedance matching function satisfactorily.

To avoid such drawbacks which result from the introduction by a notch filter of an attenuation or phase shift which is a hindrance when far from its cut-off frequencies, various solutions have been proposed in the prior art:

using values of C and L in such a way as to have a narrower filter. This results in a longer filter response time which constitutes another drawback;

producing a larger scale filter by using a more complex network of inductances and capacitors. Yet, another difficulty is involved herewith. Indeed, when filters are to be produced in relation with integrated circuits, inductance L is advantageously produced by means of a capacitor and an electronic circuit referred to as a gyrator. Indeed, a gyrator is practical to construct if one of the inductance terminals is connected to the ground. Otherwise, in the case of a more complex filter comprising inductances which are not connected to the ground, a difficult problem arises in the production of floating inductances, leading to the use of a great number of operational amplifiers, i.e., a large size integrated circuit.

Therefore, one object of the instant invention is to resolve the problem submitted without sustaining the drawbacks of the devices embodied in the prior art. More particularly, the instant invention is aimed at improving the attenuation and phase shift of a notch filter at frequencies smaller than the cut-off frequency $F_0$ but without modifying the filtration around frequency $F_0$ in a low-cost manner by the use of a simple filter, that filter being implementable as an integrated circuit.

SUMMARY OF THE INVENTION

To attain these objects, the instant invention provides a circuit compensating for the attenuation caused on a line by a series LC type notch filter at frequencies below the filter cut-off frequency with the filter connected between the line and a reference voltage, comprising:

a first resistor in series in the line, a series circuit comprising a capacitor and a second resistor connected between the line and the reference voltage, said capacitor being connected on the side of a first terminal of the first resistor, and a transconductance amplifier wherein the input is connected to the connection point of the capacitor and the second resistor and wherein the output is connected to the second terminal of the first resistor, said amplifier having transconductance at said lower frequencies capable of ensuring the injection of current equal to the sum of the currents derived by both the series circuit and the filter.

According to one embodiment of the instant invention, the first and second resistors have values substantially equal and the first capacitor has a capacitance substantially equal to that of the notch filter.

According to one embodiment of the instant invention, the connection point of the capacitor and second resistor is connected to the amplifier by a low-pass filter.

According to one embodiment of the instant invention, the low-pass filter includes a third serial resistor with a high value compared to that of the first resistor and a serial connection towards the reference voltage of a second capacitor and fourth resistor.

The instant invention applies to a SLIC in which the notch filter is a remote-charging filter.

Thus, this invention makes it possible to use a simple LC filter and to correct the attenuation provided by this circuit at frequencies well below its cut-off frequency by means of easily integrated simple means.

Another advantage of this invention as part of this application to a SLIC lies in the fact that even when the notch filter is not used in relation with an automatic charging mode, the matching attenuation coefficient is also improved at useful telephone frequencies.

BRIEF DESCRIPTION OF THE DRAWINGS

These objects, features, advantages and others of the instant invention will clearly appear from the following detailed description of preferred embodiments, in connection with the attached drawings, wherein:

Figs. 1 and 2 respectively show a conventional LC notch filter and response curve thereof;

FIG. 3 shows a conventional subscriber interface;

FIG. 4 shows, in a general manner, a circuit according to the instant invention; and FIG. 5 shows a more detailed embodiment of the instant invention.

DETAILED DESCRIPTION OF THE INVENTION

Thus, FIG. 4 schematically illustrates the fundamental aspect of the instant invention.

Given the line comprising the resistor R, current source $I_{in}$ and notch filter including capacitor C and inductance L, already shown in FIG. 1, the instant invention provides for means supplying current $I_{out}$ at the circuit output equal to current $I_{in}$ supplied by current source I1 below the cut-off frequency of filter 2. Fundamentally, this circuit includes a first means 30 for deviating current $i'$ having a predetermined relationship with current $i$ in notch filter LC and means 31 for reinjecting current $i''$ equal to the sum of currents $i$ and $i'$. This circuit 30, 31 operates for frequencies well below the cut-off frequencies LC and is inoperative around this cut-off frequency.

FIG. 5 shows an illustrative embodiment of such a circuit. In this FIG. 5, same reference numerals refer to same elements as in FIGS. 1 and 4. The circuit according to the instant invention includes a series circuit comprising capacitor C1 and resistor R1, connected across the input of resistor R and reference voltage node (the ground); a low-pass filter 32 comprising, for instance, a serial resistor R2 and a bypass including capacitor C2 and resistor R3; and an amplifier 33 to which is connected the terminal resistor R2 and to which is connected the bypass C2, R3. This amplifier 33 is, for the sake of commodity, made up of a transconductance amplifier, the second input of which is connected to the ground. The output of amplifier 33 is connected to the second terminal or output terminal of resistor R.

With such a circuitry, when a frequency $F_1$ is obtained well below the cut-off frequency $F_0$ of filter LC, the impedance of capacitor C is far greater than the impedance of inductance L and than that of resistor R. Accordingly, if C1 is chosen substantially equal to C and R1 substantially equal to R, one obtains $i'=i$ and amplifier 33 will have transconductance $gm=2/R_1$. Thus, for a frequency $F_1$ well below $F_0$, one obtains current $i_{out}$ such that:

$$i_{out}=i_{in}-1-i'+i''=i_{in},$$

since $i''=i+i'$.

Low-pass filter R2, C2, R3 renders the effect of the high frequency device negligible thus ensuring the stability of the loop shown in FIG. 3 and maintaining the impedance drop required by the use of filter LC and frequency $F_0$.

In addition to its simplicity, the circuit according to the instant invention has the advantage of being little sensitive to dispersion. Accordingly, an error of 10% in current $i''$ with respect to its nominal value will still offer an improvement of 14 dB as regards the current drop produced by said filter.

Bearing in mind what has already been explained in relation with FIG. 3 for a subscriber interface, the invention has a particularly useful application in such a field. If the resistor R in FIG. 3 is considered to correspond to resistor R of FIGS. 4 and 5, the circuit according to the invention can be changed at this point and resolve the problems linked with the addition of remote charging filters to subscriber interfaces. In experiment, it is found that by adding a circuit according to the instant invention to that of FIG. 3, the return loss RL parameter passes only from a value of 20 dB to a value of 19.5 dB, instead of dropping to a value of around 15 dB with a single LC filter.

Another advantage of the instant invention with respect to its application to circuits of the SLIC type is that it can be used even when no remote charging filter is used. In this case, the invention improves the matching attenuation towards the higher frequencies of the voice band while maintaining good loop stability. In such case, the value of capacitors C1, 3.9 nF, brings the matching attenuation code coefficient from 20 to 25 dB. Accordingly, the losses produced in capacitor C' are compensated in this way by the reinjection of the circuit current according to the invention.

As a numerical example, in the case of a circuit according to the invention being matched to a SLIC circuit having a remote-charging filter centered on a 12 kHz frequency, it is possible to choose the following values:
C=C1=6.4 nF,
L=27.3 mH,
R=R1=1 kilohm,
R2=100 kilohms,
C2=30 pF,
R3=30 kilohms,
gm=2 millimhos.

Obviously, the circuit according to the invention is described only as an example in relation with FIG. 5 and various alternatives based on the general architecture described in relation with FIG. 4 can be adopted.

I claim:

1. A compensation circuit for the attenuation caused on a line by a series LC type notch filter at frequencies less than the filter cut-off frequency, such filter being connected across the line and a reference voltage node, comprising:

a first resistor (R) in series in the line and having first and second terminals, a series circuit comprising a capacitor (C1) and a second resistor (R1) connected across the line and the reference voltage node, the capacitor being connected on the side of the first terminal of said first resistor, and an amplifier (33), the input of which is connected to the connection point of the said capacitor (C1) and of the second resistor (R1) and the output of which is connected to the second terminal of the first resistor (R), such amplifier having a transconductance at said frequencies lower than the filter cut-off frequency of such a value as to feed to the second terminal of said first resistor a current substantially equal to the sum of the currents carried by said series circuit and said notch filter.

2. An attenuation compensation circuit according to claim 1, wherein the first and second resistors have substantially equal values and the first capacitor has a capacitance substantially equal to that of said notch filter.

3. An attenuation compensation circuit according to claim 1, wherein the connection point of said capacitor (C1) and second resistor (R1) is connected to the amplifier through a low-pass filter (32).

4. An attenuation compensation circuit according to claim 3, wherein said low-pass filter includes a third series resistor (R2) having a high value compared with that of the first resistor and a series connection to the reference voltage node of a second capacitor (C2) and a fourth resistor (R3).

5. An attenuation compensation circuit according to claim 1, incorporated into an electronic subscriber interface wherein the notch filter is a remote charging filter.

* * * * *